(12) United States Patent
Fukuchi et al.

(10) Patent No.: US 9,190,336 B2
(45) Date of Patent: Nov. 17, 2015

(54) PLASMA PROCESSING APPARATUS AND PLASMA PROCESSING METHOD

(71) Applicant: Hitachi High-Technologies Corporation, Minato-ku, Tokyo (JP)

(72) Inventors: Kousuke Fukuchi, Tokyo (JP); Shigeru Nakamoto, Tokyo (JP); Tatehito Usui, Tokyo (JP); Satomi Inoue, Tokyo (JP); Kousa Hirota, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/183,562

(22) Filed: Feb. 19, 2014

(65) Prior Publication Data

US 2015/0024521 A1  Jan. 22, 2015

(30) Foreign Application Priority Data

Jul. 18, 2013  (JP) ................................. 2013-149021

(51) Int. Cl.
*H01L 21/66* (2006.01)
*H01L 21/3065* (2006.01)
*H01J 37/32* (2006.01)

(52) U.S. Cl.
CPC ............. *H01L 22/12* (2013.01); *H01J 37/3299* (2013.01); *H01J 37/32972* (2013.01); *H01L 21/3065* (2013.01)

(58) Field of Classification Search
None
See application file for complete search history.

(56) References Cited

U.S. PATENT DOCUMENTS

| 2003/0043383 A1* | 3/2003 | Usui et al. ..................... 356/504 |
| 2003/0085198 A1* | 5/2003 | Yi et al. .......................... 216/60 |
| 2008/0216956 A1* | 9/2008 | Nakamoto et al. ........ 156/345.25 |

FOREIGN PATENT DOCUMENTS

| JP | 2003-083720 A | 3/2003 |
| JP | 2010-034582 A | 2/2010 |

* cited by examiner

*Primary Examiner* — Kimberly Rizkallah
*Assistant Examiner* — Bo Bin Jang
(74) *Attorney, Agent, or Firm* — Miles & Stockbridge P.C.

(57) ABSTRACT

There is provided a plasma processing apparatus which compares a plurality of patterns detected using an interference light intensity pattern using a wavelength from at least one preset film of the plurality of film layers as a parameter and an intensity pattern using a wavelength of light from the other film as a parameter and an light intensity pattern from inside the processing chamber which is detected during processing of the film to be processed; and compares a film thickness corresponding to one of the plurality of patterns having a minimum difference obtained by the comparison and a target film thickness; and determines that the thickness of the film to be processed reaches the target film thickness.

8 Claims, 5 Drawing Sheets

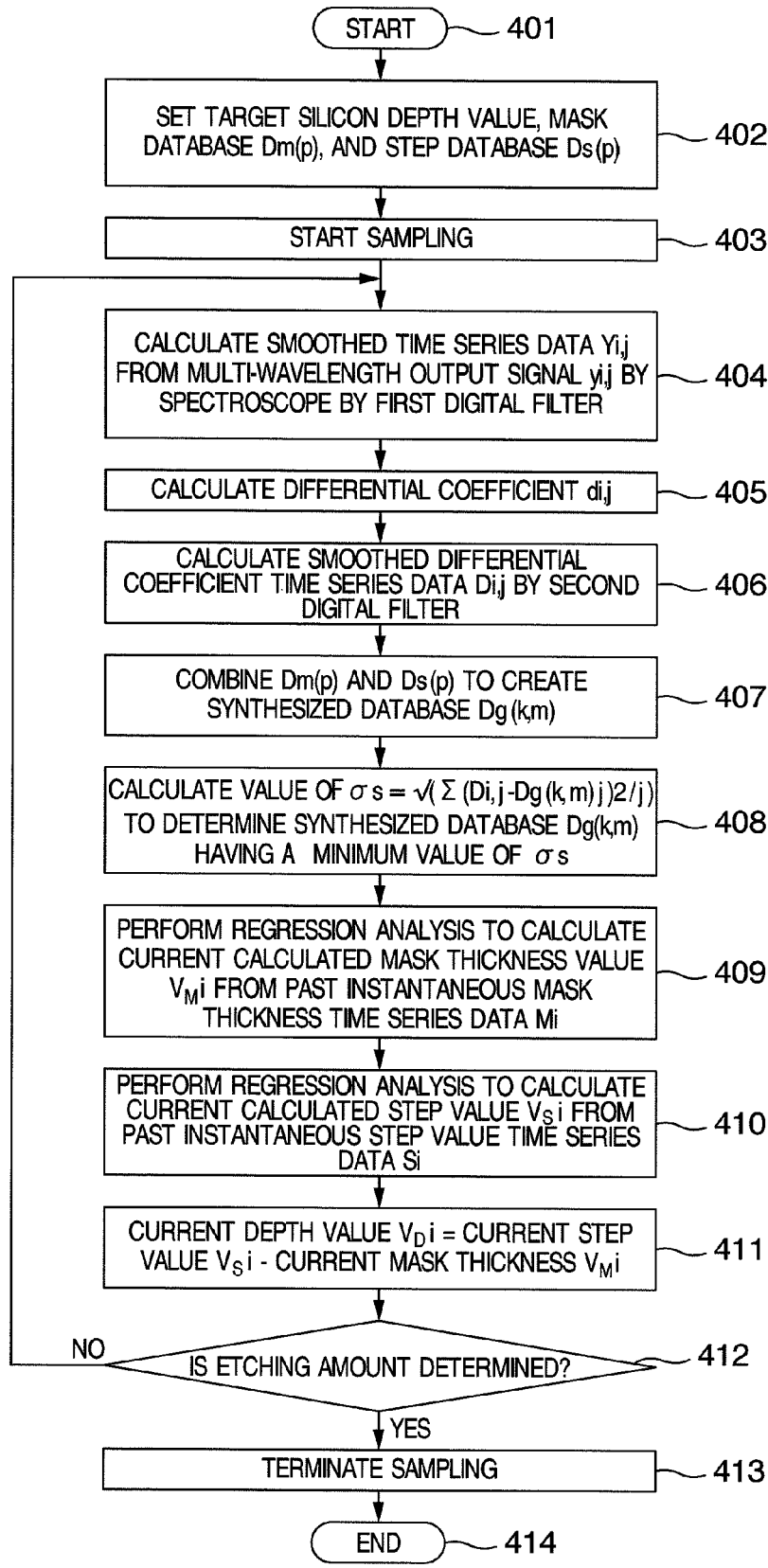

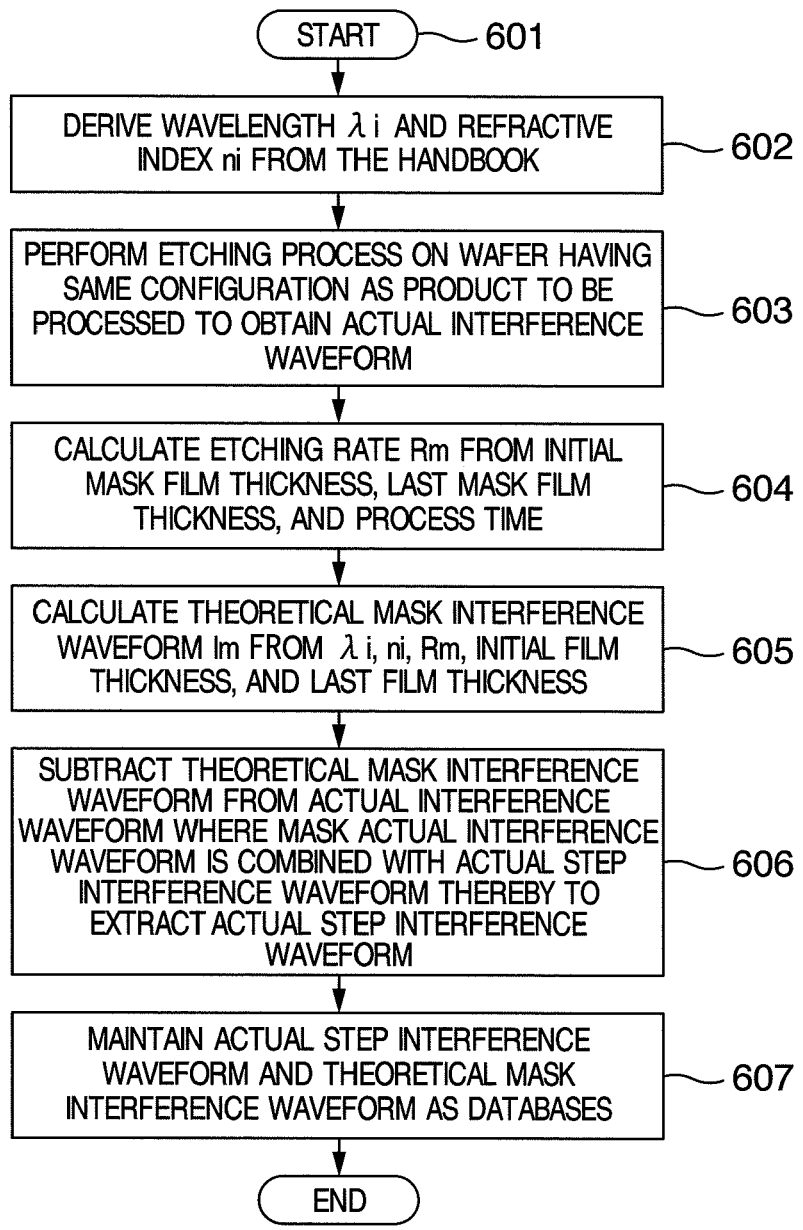

PLASMA PROCESSING APPARATUS AND PLASMA PROCESSING METHOD

BACKGROUND OF THE INVENTION

The present invention relates to a plasma processing apparatus or a plasma processing method for processing a substrate sample such as a semiconductor wafer disposed in a processing chamber inside a vacuum container using a plasma generated in the processing chamber, and more particularly to a plasma processing apparatus or a plasma processing method for processing the sample while determining the thickness or depth of a film during processing using light from a sample surface.

For semiconductor wafer fabrication, dry etching is widely used to remove a layer made of various materials formed on a wafer surface and particularly to remove a layer made of a dielectric material or to form a pattern thereon. The dry etching device plasmarizes a process gas introduced in the processing chamber inside the vacuum container to form ions and radicals, which are made to react with a wafer for wafer etching processing.

In a dry etching process of a semiconductor wafer, emitted-light intensity of a specific wavelength in plasma light changes with progress of etching of a member to be processed. In view of this, there is a conventional method of detecting a semiconductor wafer etching end point, in which a change in emitted-light intensity of a specific wavelength is detected from a plasma during the dry etching process and based on the detection results, the etching end point where the member to be processed is completely removed by etching is detected.

For example, there is a process of applying a mask material on the wafer and then etching a silicon substrate to form a groove for electrically isolating elements on the wafer in the silicon substrate. In this case, it is important to etch the silicon substrate to a predetermined depth amount before terminating the process.

Examples of the method include a method in which when plasma light is observed using optical emission spectroscopy, silicon depth increases with etching progress; light dispersed thereby forms an interference waveform, and an interference signal corresponding to the interference waveform is used to measure the depth.

There is known a method disclosed in JP-A-2010-34582, where a known light beam from outside is incident on a wafer, the wavelength of three light beams reflected from the wafer are observed, and a frequency analysis is performed thereon to calculate the etching depth.

There is known another method disclosed in JP-A-2003-83720, where interference light produced by plasma light reflected by the member to be processed is observed and the interference waveform is separated into a mask component and a step component by a wavelength band to calculate the etching depth.

SUMMARY OF THE INVENTION

In order to separate each element formed on a wafer, it is important to etch a groove in silicon to a predetermined depth amount before terminating the process.

However, JP-A-2010-34582 causes the following problem. The prior art considers that light reflected from the wafer interferes with only a surface layer of a film (silicon) to be etched and an etching bottom portion. Actually, the light also is reflected, for example, from a surface layer of a resist mask formed on an upper portion of the silicon, and hence the remaining film amount of the resist mask needs to be considered. Therefore, this method cannot accurately detect the depth of the film (silicon) to be etched.

In addition, JP-A-2003-83720 causes the following problem. For example, when the interference waveform of the mask component and the interference waveform of the step component are overlapped with each other in the entire wavelength, the mask component cannot be separated from the step component by the wavelength band. Therefore, this method may not accurately detect the depth of the film (silicon) to be etched.

It is an object of the present invention to provide a plasma processing apparatus or a plasma processing method which can detect an etching amount with high precision by reducing an influence from a mask material formed on a substrate.

The above object is achieved by the following processing or configuration. That is, a synthesized waveform pattern is obtained by synthesizing a theoretical mask interference waveform pattern obtained by theoretically creating an interference waveform from a mask material with an actual step waveform pattern extracted from an actual interference waveform pattern obtained by actual etching. Then, a time derivative is obtained for each of a plurality of wavelengths of interference light obtained from a semiconductor wafer surface during etching to obtain a pattern of a differential value of the interference waveform; and the pattern is compared with the synthesized waveform pattern to precisely detect the depth value of the member to be processed.

This method can accurately detect the depth value of the member to be processed by considering the influence of the mask material formed on the member to be processed. Other objects, features and advantages of the invention will become apparent from the following description of the embodiments of the invention taken in conjunction with the accompanying drawings.

According to another of its aspects, the invention provides a plasma processing apparatus having a wafer disposed in a processing chamber inside a vacuum container, the plasma processing apparatus being configured to process a film structure disposed on the wafer using a plasma generated in the processing chamber, the film structure having a plurality of film layers disposed on the wafer including a film layer to be processed and a mask layer disposed on the film layer to be processed, the plasma processing apparatus comprising a determination unit configured to: compare a plurality of synthesized light intensity patterns with a light intensity pattern of light from the processing chamber detected during processing of the film layer to be processed, compare a film thickness corresponding to a synthesized pattern, which has a minimum difference from the light intensity pattern detected during processing, with a target film thickness, and determine whether the film thickness of the film to be processed reached the target film thickness, wherein the synthesized light intensity patterns use wavelength as a parameter, and the light intensity pattern uses wavelength as a parameter, and wherein the plurality of synthesized light intensity patterns are obtained by synthesizing interference light intensity patterns with light intensity patterns obtained from interference light detected from the mask layer, the interference light intensity patterns having been obtained from interference light detected from a previous processing of the film layer to be processed on another wafer, and wherein the interference light intensity patterns use wavelength as a parameter, and the light intensity patterns obtained from interference light detected from the mask use wavelength as a parameter.

According to still another of its aspects, the invention provides a plasma processing method of processing a film structure disposed on a wafer in a processing chamber using a plasma generated in the processing chamber, the film structure including a film layer to be processed and a mask layer on the film layer, the plasma processing method comprising the steps of comparing a plurality of synthesized light intensity patterns with a light intensity pattern of a light detected from the processing chamber during processing of the film layer to be processed, comparing a film thickness corresponding to a synthesized pattern, which has a minimum difference from the light intensity pattern detected during processing, with a target film thickness, and determining whether the film thickness of the film to be processed reached the target film thickness, wherein the synthesized light intensity patterns use wavelength as a parameter, and the light intensity pattern uses wavelength as a parameter, and wherein the plurality of synthesized light intensity patterns are obtained by synthesizing interference light intensity patterns with light intensity patterns obtained from interference light detected from the mask layer, the interference light intensity patterns having been obtained from interference light detected from a previous processing of the film layer to be processed on another wafer, and wherein the interference light intensity patterns use wavelength as a parameter, and the light intensity patterns obtained from interference light detected from the mask use wavelength as a parameter.

BRIEF DESCRIPTION OF THE DRAWINGS

FIG. 3 is a flowchart illustrating a process flow of the plasma processing apparatus according to the embodiment illustrated in FIG. 1;

FIG. 5 is a flowchart illustrating a pattern forming flow of the plasma processing apparatus according to the embodiment illustrated in FIG. 1.

DETAILED DESCRIPTION OF THE EMBODIMENT

Hereinafter, an embodiment of the present invention will be described with reference to the accompanying drawings.

Hereinafter, a first embodiment of the present invention will be described with reference to FIGS. 1 to 5.

Figure 1:
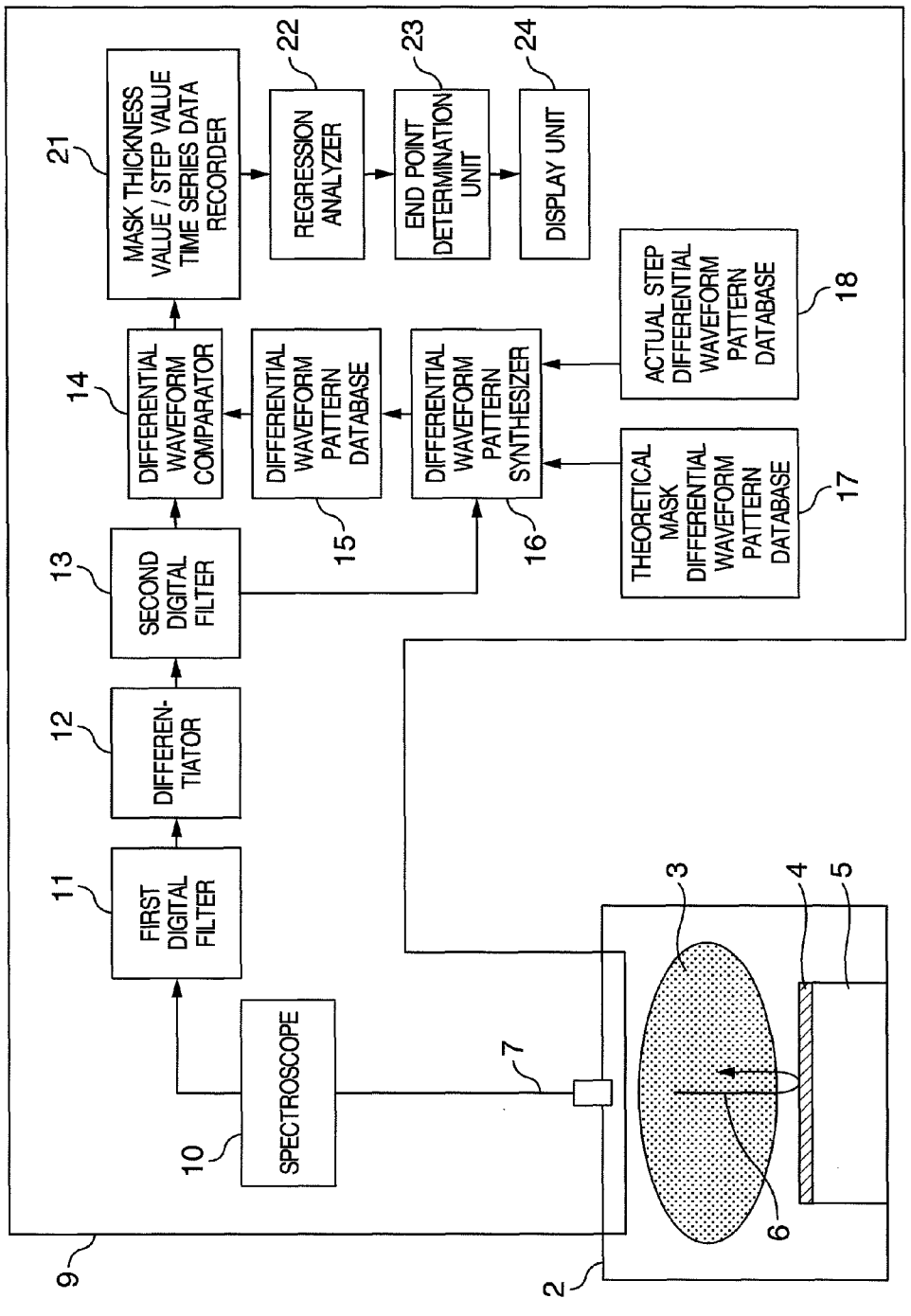
FIG. 1 is a diagram schematically illustrating a configuration of a plasma processing apparatus according to an embodiment of the present invention.

FIG. 1 is a diagram schematically illustrating a configuration of the plasma processing apparatus according to the embodiment of the present invention, in which a vacuum container 2 is illustrated as a longitudinal sectional view.

A plasma processing apparatus 1 of the present embodiment includes the vacuum container 2 and a depth monitor 9. An etching gas is introduced from an unillustrated gas introduction means into the vacuum container 2. The etching gas is decomposed by microwave power or the like into a plasma 3. The plasma 3 is used to etch a member to be processed 4 such as a semiconductor wafer on a sample stage 5.

The depth monitor 9 of the present embodiment includes an optical fiber 7, a spectroscope 10, a first digital filter 11, a differentiator 12, a second digital filter 13, a differential waveform comparator 14, a differential waveform pattern database 15, a differential waveform pattern synthesizer 16, a theoretical mask differential waveform pattern database 17, an actual step differential waveform pattern database 18, a mask thickness value/step value time series data recorder 21, a regression analyzer 22, an end point determination unit 23 and a display unit 24.

Note that FIG. 1 illustrates a functional configuration of the depth monitor 9, and hence the actual configuration of the depth monitor 9 other than the optical fiber 7, the spectroscope 10, and the display unit 24 may include a CPU; a ROM for storing various data such as a mask material remaining film thickness measurement processing program or a silicon etching depth measurement processing program, as well as the interference light differential waveform pattern database 15, the theoretical mask differential waveform pattern database 17, and the actual step differential waveform pattern database 18; a RAM for maintaining measurement data; a storage device such as an external storage device; a data input/output device; and a communication control device.

Interference light from the member to be processed 4 is guided to the spectroscope 10 in the depth monitor 9 through the optical fiber 7, and undergoes a silicon etching depth measurement process or a mask material remaining film thickness measurement process and an etching process end point determination process based on the state thereof.

In the spectroscope 10, incident plasma light is spectrally divided, and the emitted-light intensity of multi-wavelength interference light is converted to a current detection signal corresponding to the emitted-light intensity for each specific wavelength and is converted to a voltage signal. A plurality (j) of specific wavelength signals outputted as sampling signals from the spectroscope 10 are stored as time series data $yi,j$ in an unillustrated storage device such as a RAM.

The time series data $yi,j$ at time i undergoes a smoothing process by the first digital filter circuit 11, and then is stored as smoothed time series data $Yi,j$ in an unillustrated storage device such as a RAM.

Based on the smoothed time series data $Yi,j$, the differentiator 12 calculates time series data $di,j$ of a differential coefficient value (first-order differential value or second-order differential value), which is stored in an unillustrated storage device such as a RAM.

The time series data $di,j$ of the differential coefficient value is smoothed by the second digital filter circuit 13 and is stored as smoothed differential coefficient time series data $Di,j$ in an unillustrated storage device such as a RAM. Then, from the smoothed differential coefficient time series data $Di,j$, an actual pattern indicating a wavelength dependence of an interference light intensity differential value (using wavelength j as a parameter) is obtained.

Here, the description focuses on a calculation of the smoothed differential coefficient time series data Di. For example, a second-order Butterworth low-pass filter is used as the digital filter circuit 13. The smoothed time series data Yi is calculated through the second-order Butterworth low-pass filter by expression (1).

$$Yi = b1 \cdot yi + b2 \cdot yi-1 + b3 \cdot yi-2 - [a2 \cdot Yi-1 + a3 \cdot Yi-2] \quad (1)$$

where the coefficients a and b differ in numerical value depending on the sampling frequency and the cutoff frequency. Note that an example of the coefficient values of the digital filter is that $a2=-1.143$, $a3=0.4128$, $b1=0.067455$, $b2=-0.013491$, $b3=0.067455$ (at a sampling frequency of 10 Hz and at a cutoff frequency of 1 Hz).

The time series data di of the second-order differential coefficient value is calculated through the differentiator 12 using polynomial adaptive smoothing differentiation for the time series data Yi of five points by the following expression (2).

$$di = \sum_{j=-2}^{j=2} wj \cdot Yi+j \quad (2)$$

where the weighting factor w is that w−2=2, w−1=−1, w0=−2, w1=−1, w2=2.

Using the time series data di of the differential coefficient value, the smoothed differential coefficient time series data Di is calculated through the digital filter circuit 13 such as a second-order Butterworth low-pass filter by the following expression (3).

$$Di=b1 \cdot di+b2 \cdot di-1+b3 \cdot di-2-[a2 \cdot Di-1+a3 \cdot Di-2] \quad (3)$$

Meanwhile, the differential waveform pattern database Dg(k,m) 15 stores the differential waveform patterns of the interference light intensity corresponding to the each wavelength in which a previously etched interference pattern and a theoretical mask pattern are created.

The differential waveform pattern database Dg(k, m) 15 is obtained through the differential waveform pattern synthesizer 16 which synthesizes the theoretical mask differential waveform pattern database Dm(p) 17 and the actual step differential waveform pattern database Ds(p) 18. Note that the differential waveform pattern database Dg(k,m) 15, the theoretical mask differential waveform pattern database Dm(p) 17, and the actual step differential waveform pattern database Ds(p) 18 are stored in an unillustrated storage device such as a RAM. Here, each of k and m is a variable indicating an arbitrary time.

The method of creating the theoretical mask differential waveform pattern database 17 and the actual step differential waveform pattern database will be described later with reference to FIG. 5. The differential waveform pattern synthesizer 16 adds and combines Dm(p) and Ds(p) to create a differential waveform pattern.

Specifically, the following pattern is created:

Dg(0,0)=Dm(0)+Ds(0), Dg(0,1)=Dm(0)+Ds(1), Dg(0,2)=Dm(0)+Ds(2), . . . ,Dg(0,p)=Dm(0)+Ds(p), Dg(1,0)=Dm(1)+Ds(0), . . . ,Dg(p,p)=Dm(p)+Dg(p)

The present embodiment creates the above pattern by combining each pattern data of Dm(p) and Ds(p) corresponding to each of a plurality of time series {p} including the arbitrary time t of the time series for determining the film thickness.

As the range of p for use in creating the synthesized pattern, for example, the present embodiment selects a range of 10% of the entire process time in a positive direction and a negative direction from the current time t of the time series for determining the film thickness. The Dg may preliminarily store a pattern of (p+1)×(p+1) in memory or may store only Dg near a pattern corresponding to the etching depth amount for each sampling.

The differential waveform comparator 14 compares the differential waveform pattern database Dg 15 and the currently obtained smoothed differential coefficient time series data Di,j to obtain Dg(k,m) closest to the current pattern. The differential waveform comparator 14 determines the current mask thickness value and the step value from (k,m) and stores the value in the mask thickness value/step value time series data recorder 21. Note that the determined mask thickness value is referred to as an instantaneous mask thickness value and the determined step value is referred to as an instantaneous step value. The obtained instantaneous mask thickness value is referred to as Mi and the obtained instantaneous step value is referred to as Si.

The regression analyzer 22 obtains a current calculated mask thickness value VMi and a current calculated step value VSi at time i using regression line approximation of an instantaneous mask thickness value and an instantaneous step value at time i or earlier. Note that the current mask thickness value obtained by regression line approximation using an instantaneous mask thickness value at a past time is referred to as a calculated mask thickness value, and a current step value obtained by regression line approximation using an instantaneous step value at a past time is referred to as a calculated mask thickness value.

Here, the description focuses on the calculation of the calculated mask thickness value VMi and the calculated step value VSi by regression line approximation. Past instantaneous mask thickness values or past instantaneous step values (for example, at past 30 points) are used to calculate a first-order regression line Y=Xa×t+Xb (where Y: instantaneous mask thickness value or instantaneous step value, Xa: absolute value of etching rate, t: etching time, and Xb: initial mask thickness value or initial step value). Then, the current time is inserted in the first-order regression line to thereby calculate the current calculated mask thickness value VMi and the current calculated step value VSi. Each time an instantaneous mask thickness value or an instantaneous step value at a next time is inputted, the first-order regression line is calculated again.

Further, the calculated mask thickness value VMi is subtracted from the calculated step value VSi to obtain the calculated depth value VDi. The end point determination unit 23 determines whether or not the calculated depth value VDi is equal to or less than a preset target depth before terminating the etching process. The display unit 24 displays the results of the etching amount of the member to be processed obtained by the above process.

Figure 2A:
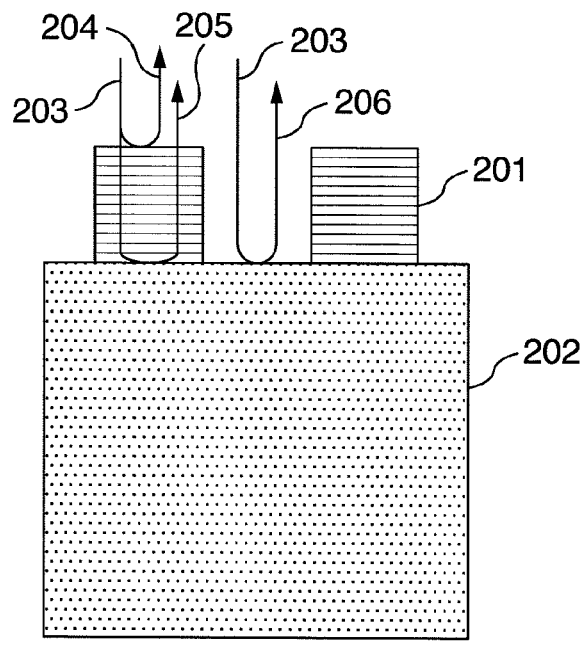
FIGS. 2A and 2B are longitudinal sectional views each schematically illustrating a configuration of a film structure to be processed by the plasma processing apparatus according to the embodiment illustrated in FIG. 1.
Figure 2B:
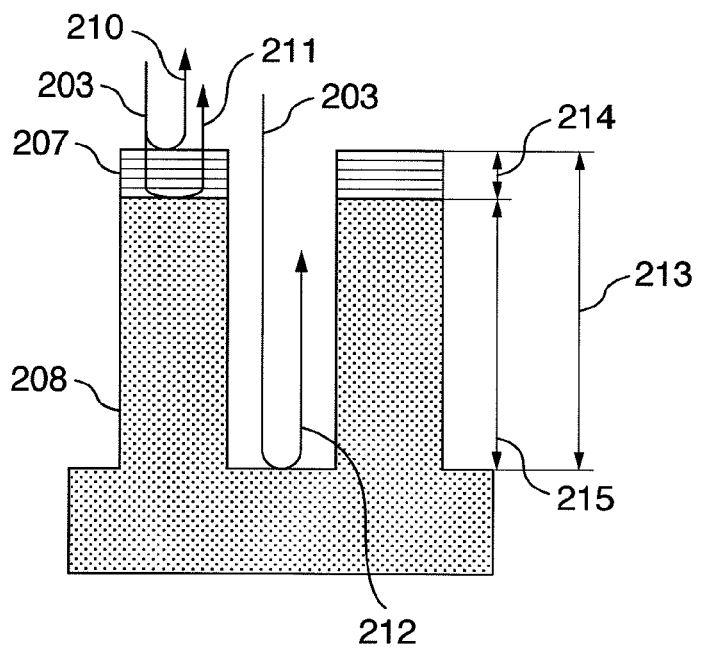

FIGS. 2A and 2B are a longitudinal sectional view schematically illustrating a configuration of a film structure to be processed by the embodiment illustrated in FIG. 1.

FIG. 2A schematically illustrates the film structure including a mask layer 201 and a silicon layer 202 immediately after the etching process starts.

FIG. 2B schematically illustrates the film structure including a mask layer 207 and a silicon layer 208 after the plasma processing apparatus 1 illustrated in FIG. 1 ends the plasma process.

When plasma emission 203 is incident on a wafer illustrated in FIG. 2A immediately after the etching process starts, reflected light 204 occurs on a surface of the mask layer 201; reflected light 205 occurs in a boundary between the mask layer 201 and the silicon layer 202; and reflected light 206 occurs on a surface of the silicon layer 202.

When plasma emission 203 is incident on a wafer illustrated in FIG. 2B during the etching process, reflected light 210 occurs on a surface of the mask layer 207; reflected light 211 occurs in a boundary between the mask layer 207 and the silicon layer 208; and reflected light 212 occurs on a surface of the silicon layer 208. In FIG. 2B, the step value 213 is referred to as VS; the mask thickness 214 is referred to as VM; and the depth value 215 is referred to as VD.

FIG. 3 is a flowchart illustrating a procedure for determining the depth of a layer to be processed when performing a plasma process on a wafer having both the mask layer 201 and the silicon layer 202 illustrated in FIGS. 2A and 2B.

The process starts with setting a target silicon depth value (target etching amount), a mask database Dm(p), and a step database Ds(p) (step 402). Note that the detail of the step 402 will be described later with reference to FIG. 5.

In the next step, sampling of interference light from the wafer starts (for example, for each 0.25 to 0.5 seconds) (step 403). Specifically, when the etching process starts, a sampling start instruction is issued. The photodetector (spectroscope 10) detects a multi-wavelength emitted-light intensity varying with etching progress as a light detection signal of a voltage corresponding to the emitted-light intensity. The light detection signal for each wavelength j from the spectroscope 10 is converted to a digital signal to obtain a sampling signal yi,j.

Next, the first digital filter 11 smoothes the multi-wavelength output signal yi,j from the spectroscope 10 to calculate a smoothed time series data Yi,j (step 404). Specifically, the first digital filter reduces noise to obtain the smoothed time series data Yi,j.

Next, the differentiator 12 differentiates the smoothed time series data Yi,j by a common differentiation to calculate a differential coefficient di,j for each wavelength (step 405). For example, a S-G method (Savitzky-Golay method) or a difference method may be used to perform differentiation in a pseudo manner. The differentiation process produces a differential coefficient (first-order or second-order) di,j of a signal waveform for each wavelength.

Further, the second digital filter 13 calculates the smoothed differential coefficient time series data Di,j (step 406).

Next, the mask database Dm(p) and the step database Ds(p) are combined to create a synthesized database Dg(k,m) (step 407). Specifically, a (p+1)×(p+1) pattern of Dg(0,0)=Dm(0)+Ds(0), Dg(0,1)=Dm(0)+Ds(1), ..., Dg(p,p)=Dm(p)+Dg(p) is created. As described above, an example of the range of p for use in the combination here include a range of 10% of the entire process time in a positive direction and a negative direction from the current time.

Then, the differential waveform comparator 14 calculates a value of matching pattern deviation (minimum) σs=√(Σ(Di,j−Dg(k,m)j)2/j), and determines a synthesized database Dg(k,m) having a minimum value of the matching pattern deviation (minimum) as with respect to the smoothed differential coefficient time series data Di,j (step 408).

Note that k in Dg(k,m) corresponds to a mask database Dm(k), and m in Dg(k,m) corresponds to a step database Ds(m). Note also that k(k=0, ..., p) and m(m=0, ..., p) denote a number indicating the sampling time. The mask database Dm(k) is composed of a theoretical mask interference waveform pattern indicating a wavelength dependence at time k, and the step database Ds(m) is composed of an actual step interference waveform pattern indicating a wavelength dependence at time m. Specifically, as k and m are determined by the differential waveform comparator 14, the current instantaneous mask thickness value Mi and the instantaneous step value Si are determined.

Regression analysis is performed to calculate the current calculated mask thickness value VMi from the past instantaneous mask thickness time series data Mi. Regression analysis is further performed to calculate the current calculated step value VSi from the past instantaneous step value time series data Si.

The calculated mask thickness VMi is subtracted from the calculated step value VSi to thereby calculate the calculated depth value VDi (step 411).

The etching amount is determined by comparing the calculated depth value VDi with the target silicon depth value (step 412). If the current calculated depth value VDi reaches the target silicon depth value, the etching is terminated to end the sampling (step 413). If the current calculated depth value VDi does not reach the target silicon depth value, the process returns to step 404.

Figure 4A:
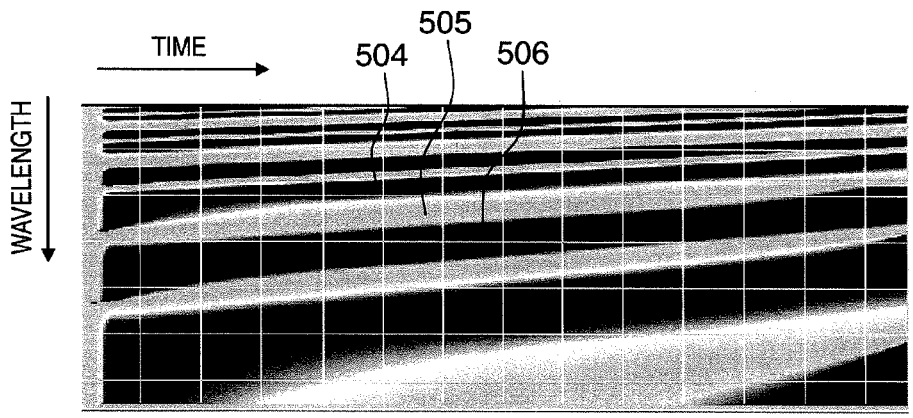
FIGS. 4A, 4B and 4C are graphs illustrating interference light intensity data using a wavelength as a parameter, which is obtained when the film structure illustrated in FIGS. 2A, 2B is processed by the plasma processing apparatus according to the embodiment illustrated in FIG. 1.
Figure 4B:
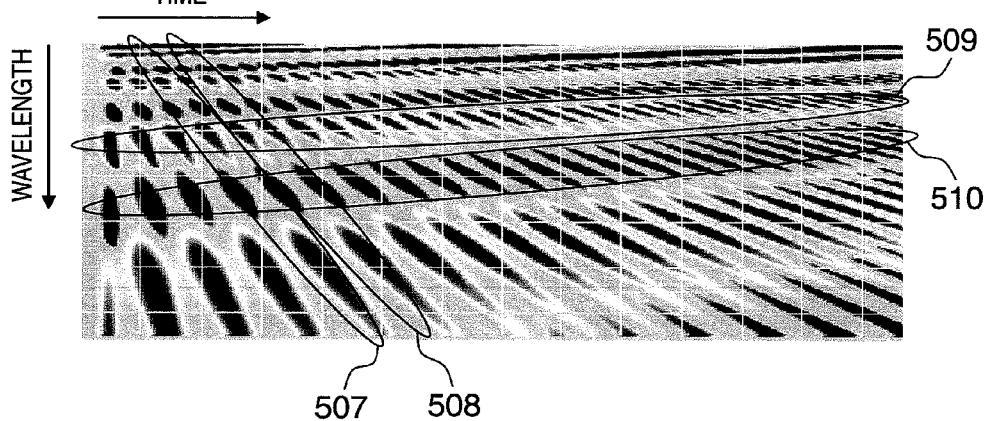
Figure 4C:
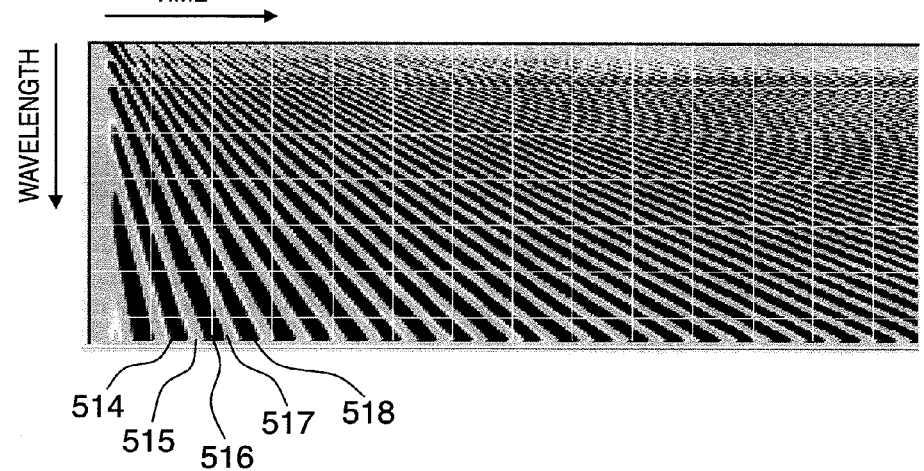

FIGS. 4A, 4B, and 4C each are a graph illustrating interference waveform data for each wavelength which can be obtained when the plasma processing apparatus according to the embodiment illustrated in FIG. 1 processes a sample whose film structure is schematically illustrated in FIGS. 2A and 2B so that the positive differential values are red, the differential values near zero are green, and the negative differential values are blue. The wavelength is plotted on the vertical axis and the time is plotted on the horizontal axis.

FIG. 4A illustrates the theoretical mask interference waveform. FIG. 4B illustrates the actual interference waveform obtained when the wafer having the film structure illustrated in FIGS. 2A and 2B is actually etched. In FIG. 4B, reference numerals 507 and 508 indicate a step component of the interference waveform caused by silicon etching in the actual interference waveform; and reference numerals 509 and 510 indicate a mask component of the interference waveform caused by a reduction of the mask remaining film due to etching in the actual interference waveform. FIG. 4C illustrates the actual step interference waveform obtained by subtracting the interference waveform of FIG. 4A from the interference waveform of FIG. 4B at a ratio corresponding to the wafer open area ratio.

The description focuses on an example of the actual step interference waveform illustrated in FIG. 4C. First, the definition equation of an optical path difference is expressed by the following expression (4).

$$2dn/\cos\theta = m\lambda \quad (4)$$

(where m=0, 1, 2 ..., which takes a maximum value when m is an integer, n denotes a refractive index, θ denotes an incident angle, and d denotes a film thickness).

Before the etching process starts, the optical path difference due to a step corresponds to the mask thickness. As the etching process advances, the optical path difference increases. At this time, as apparent from the expression (4), it is understood that the optical path difference 2d taking a maximum value depends on the wavelength (for simplicity, θ=0 is assumed). Specifically, the wavelength period on a long wavelength side is longer than the wavelength period on a short wavelength side. Thus, it is understood that as the wavelength becomes longer like the actual step interference waveform of FIG. 4C, a positive differential value 514, a differential value 515 near zero, and a negative differential value 516 are declining.

In the theoretical mask interference waveform of FIG. 4A, as opposed to the actual step interference waveform of FIG. 4C, as the etching process advances, the mask thickness decreases, that is, the optical path difference decreases. Thus, as the wavelength becomes longer like the theoretical mask interference waveform of FIG. 4A, a positive differential value 504, a differential value 505 near zero, and a negative differential value 506 is rising.

The actual interference waveform of FIG. 4B is a waveform obtained when the wafer having the film structure illustrated in FIGS. 2A and 2B is actually etched, which is like a waveform where the theoretical mask interference waveform of FIG. 4A is combined with the actual step interference waveform of FIG. 4C.

Thus, the actual step interference waveform is derived by removing the theoretical mask interference waveform from the actual interference waveform.

FIG. 5 is a flowchart illustrating a process of calculating the theoretical mask interference waveform and subtracting the theoretical mask interference waveform from the actual interference waveform to thereby extract the actual step interference waveform.

First, a refractive index ni corresponding to a wavelength $\lambda i$ of the mask material is acquired (step 602). Note that the mask material is obtained from a document such as "Handbook of Optical Constants of Solids" (Edward D. Palic (Naval Research Laboratory Washington D.C.), Academic Press, Inc. 1985) listing the physical properties and the like of the layer to be processed.

Next, the etching process is performed on a sample wafer having the same configuration as the product wafer to obtain the actual interference waveform (step 603). Then, an etching rate Rm is calculated from an initial mask film thickness of the wafer actually subjected to the etching process, a last mask film thickness thereof, and an etching process time t (step 604). Here, the etching rate Rm is calculated by Rm=(initial mask film thickness−last mask film thickness)/t.

Specifically, the initial film thickness of the mask obtained before the process starts, the interference waveform data obtained during the etching process, and the last film thickness of the wafer obtained by measuring the wafer after the process by SEM can be used to calculate the etching rate from the amount of chipping of the mask when the etching process is performed and the etching process time t.

Next, the theoretical mask interference waveform Im is calculated from $\lambda i$ and ni obtained in step 602, Rm obtained in step 604, and the initial mask film thickness (step 605). Such a theoretical interference waveform Im can be calculated using a conventionally known technique (such as Fresnel amplitude reflection coefficient and other methods).

Next, the theoretical mask interference waveform is subtracted from the actual interference waveform where the mask actual interference waveform is combined with the actual step interference waveform thereby to extract the actual step interference waveform (step 606). When the theoretical mask interference waveform is subtracted from the actual interference waveform, the ratio of the theoretical mask interference waveform to be subtracted from the actual interference waveform is determined, for example, by the open area ratio of the obtained wafer.

Last, the actual step interference waveform obtained in step 606 and the theoretical mask interference waveform obtained in step 605 are maintained as databases (step 607). At this time, the databases are stored in a storage device such as a ROM and a RAM, or an external storage device.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus having a wafer disposed in a processing chamber inside a vacuum container, the plasma processing apparatus being configured to process a film structure disposed on the wafer using a plasma generated in the processing chamber, the film structure having a plurality of film layers disposed on the wafer including a film layer to be processed and a mask layer disposed on the film layer to be processed, the plasma processing apparatus comprising a determination unit configured to:

compare a plurality of synthesized light intensity patterns with a light intensity pattern of light from the processing chamber detected during processing of the film layer to be processed;

compare a film thickness corresponding to a synthesized light intensity pattern, which has a minimum difference from the light intensity pattern detected during processing, with a target film thickness; and determine whether the film thickness of the film to be processed reached the target film thickness, wherein the synthesized light intensity patterns use wavelength as a parameter, and the light intensity pattern detected during processing uses wavelength as a parameter, and wherein the plurality of synthesized light intensity patterns are obtained by synthesizing interference light intensity patterns with light intensity patterns obtained from interference light detected from the mask layer, the interference light intensity patterns having been obtained from interference light detected from a previous processing of the film layer to be processed on another wafer, wherein the interference light intensity patterns use wavelength as a parameter, and the light intensity patterns obtained from interference light detected from the mask layer use wavelength as a parameter.

2. The plasma processing apparatus according to claim 1, wherein the mask layer is composed of a material which transmits light.

3. The plasma processing apparatus according to claim 1, wherein, during processing, the mask layer has a smaller change in film thickness than a change in the film thickness of the film layer to be processed.

4. The plasma processing apparatus according to claim 3, wherein the mask layer is composed of a material which transmits light.

5. A plasma processing method of processing a film structure disposed on a wafer in processing chamber, the film structure including a film layer to be processed and a mask layer on the film layer, the plasma processing method comprising the steps of:

comparing a plurality of synthesized light intensity patterns with a light intensity pattern of a light detected from the processing chamber during processing of the film layer to be processed;

comparing a film thickness corresponding to a synthesized light intensity pattern, which has a minimum difference from the light intensity pattern detected during processing, with a target film thickness; and determining whether the film thickness of the film to be processed reached the target film thickness, wherein the synthesized light intensity patterns use wavelength as a parameter, and the light intensity pattern detected during processing uses wavelength as a parameter, and wherein the plurality of synthesized light intensity patterns are obtained by synthesizing interference light intensity patterns with light intensity patterns obtained from interference light detected from the mask layer, the interference light intensity patterns having been obtained from interference light detected from a previous processing of the film layer to be processed on another wafer, wherein the interference light intensity patterns use wavelength as a parameter, and the light intensity patterns obtained from interference light detected from the mask layer use wavelength as a parameter.

6. The plasma processing method according to claim 5, wherein the mask layer composed of a material which transmits light.

7. The plasma processing method according to claim 5, wherein, during processing, the mask layer has a smaller change in film thickness than a change in the film thickness of the film layer to be processed.

8. The plasma processing method according to claim 7, wherein the mask layer is composed of a material which transmits light.

* * * * *